United States Patent
Lee et al.

(10) Patent No.: US 7,227,782 B2
(45) Date of Patent: Jun. 5, 2007

(54) NAND FLASH MEMORY DEVICE CAPABLE OF IMPROVING READ SPEED

(75) Inventors: Seung-Jae Lee, Seoul (KR); Jung-Hoon Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 4 days.

(21) Appl. No.: 11/285,273

(22) Filed: Nov. 22, 2005

(65) Prior Publication Data

US 2006/0109715 A1    May 25, 2006

(30) Foreign Application Priority Data

Nov. 22, 2004    (KR)    ............... 10-2004-0095861

(51) Int. Cl.
G11C 11/34    (2006.01)

(52) U.S. Cl. .................. 365/185.17; 365/189.05; 365/200

(58) Field of Classification Search ......... 365/185.17, 365/185.05, 200
See application file for complete search history.

(56) References Cited

U.S. PATENT DOCUMENTS 5,289,413 A * 2/1994 Tsuchida et al. ....... 365/189.02
6,462,998 B1 * 10/2002 Proebsting ................ 365/205

FOREIGN PATENT DOCUMENTS

| JP | 1993 05182491 | 7/1993 |
| KR | 1998 055765 | 9/1998 |
| KR | 1999 0079926 | 11/1999 |
| KR | 2002 0094356 | 12/2002 |

OTHER PUBLICATIONS

English Abstract.

* cited by examiner

*Primary Examiner*—Tuan T. Nguyen
(74) *Attorney, Agent, or Firm*—F. Chau & Assoc., LLC

(57) ABSTRACT

A NAND flash memory device which includes a first page buffer circuit reading main data bits from the main field during a read operation, a second page buffer circuit reading redundant data bits from the redundancy field during the read operation, a first column gate circuit configured to select a part of the read main data bits and a part of the read redundant data bits in response to first column selection signals at the same time, and a second column gate circuit configured to select a part of the selected main data bits in response to second column selection signals.

15 Claims, 3 Drawing Sheets

NAND FLASH MEMORY DEVICE CAPABLE OF IMPROVING READ SPEED

CROSS-REFERENCE TO RELATED APPLICATIONS

This U.S. non-provisional patent application claims priority under 35 U.S.C. § 119 of Korean Patent Application 2004-95861 filed on Nov. 22, 2004, the entire contents of which are hereby incorporated by reference.

BACKGROUND OF THE INVENTION

1. Technical Field

The present invention relates to a semiconductor memory device, and more particularly, to a NAND flash memory device.

2. Discussion of Related Art

In semiconductor memory devices, redundant circuits are often used to improve production yield. In general, redundant circuits may be classified into row redundant circuits and column redundant circuits. The row redundant circuits include one or more rows of memory cells and related circuits required for activating redundant rows and defective rows of memory cells. Similarly, the column redundant circuit includes one or more columns of memory cells and a circuit required for activating redundant columns and deactivating defective columns of memory cells.

FIG. 1 is a block diagram schematically showing a conventional NAND flash memory device.

Referring to FIG. 1, a conventional NAND flash memory device includes a main field 10 and a redundant field 20. The main field 10 includes a memory cell array for storing main data, and a plurality of rows (or word lines) and a plurality of main columns (or main bit lines) arranged in the memory cell array. As widely known, a memory cell array of a NAND flash memory device has a NAND string structure. The redundant field 20 includes a redundancy memory cell array for replacing defective columns of the main field, and, as is obvious to one skilled in the art, the redundant memory cell array has the same structure as the main field 10. A main page buffer circuit 30 reads data stored in the main field 10 in a page unit during a read operation. A redundant page buffer circuit 40 reads data stored in the redundant field 20 during the read operation. Here, as is apparent to those having ordinary skill, the main field 10 and the redundant field 20 are configured to share the same row. In other words, when a row or page is selected, the main page buffer circuit 30 and the redundant page buffer circuit 40 read data from memory cells of the main and the redundant fields 10 and 20 connected to the selected row at the same time. The main page buffer circuit 30 and the redundant page buffer circuit 40 include page buffers which are widely known in this field.

Referring to FIG. 1, a column decoder circuit 50 generates column selection signals YSi in response to a column address YA, and a column gate circuit 60 generates main columns or main page buffers of the main field 10 in a predetermined unit such as a byte or a word in response to the column selection signals YSi. Main data bits MDm of the selected main rows or page buffers are transmitted to the multiplexer block 70. The redundant column gate circuit 80 is controlled by a redundancy control circuit 90, and selects at least one of the redundant columns of the redundant field 20 or the page buffers of the redundant page buffer circuit. The redundant data bits RDn (where n is 1 or an integer greater than 1) of the selected redundant columns or page buffers are transmitted to a multiplexer block 70.

The multiplexer block 70 receives the main and redundant data bits MDm and RDn which are output from the gate circuits 60 and 80, and outputs the main data bits MDm or the main and redundant data bits MDm and RDn in accordance with redundancy information from the redundant control circuit 90. For example, if all the main bits of the currently selected columns (or page buffers) are normal, the multiplexer block 70 outputs the main data bits MDm in accordance with the control of the redundancy control circuit 90. If one of the main data bits of the currently selected columns (or page buffers) is a defective data bit, the multiplexer block 70 outputs a redundancy data bit RDn together with other main data bits, instead of the defective main data bit in accordance with the redundancy information. The redundancy control circuit 90 is formed to store information of the addresses of the defective columns (or page buffers), and controls the redundancy column gate circuit 80 and the multiplexer block 70 in response to the input row address YA. It is apparent that the redundancy control circuit 90 is realized using a fuse box and a logic circuit widely known to those having ordinary skill in the art.

In the case of a NAND flash memory device as shown in FIG. 1, the time for transmitting the main data to the multiplexer block 70 is influenced by the column decoder circuit 50, while the time for transmitting the redundancy data to the multiplexer block 70 is influenced by the redundancy control circuit 90. In other words, the column gate circuit 60 and the redundancy column gate circuit 80 are controlled by different paths (a decoding path of a column decoder circuit and a decoding path of a redundancy control circuit). As a result, the time for outputting the main data is influenced by the redundancy gate circuit 80 controlled by the redundancy control circuit according to a column address.

SUMMARY OF THE INVENTION

Provided is a NAND flash memory device including a main field and a redundant field comprises: a first page buffer circuit reading main data bits from the main field during a read operation; a second page buffer circuit reading redundant data bits from the redundancy field during the read operation; a first column gate circuit configured to select a part of the read main data bits and a part of the read redundant data bits in response to first column selection signals during the same time; and a second column gate circuit configured to select a part of the selected main data bits in response to second column selection signals.

In an exemplary embodiment of the present invention, the NAND flash memory device further comprises: a multiplexer circuit receiving the main data bits from the second column gate circuit and the redundant data bits from the first column gate circuit; and a redundancy control circuit configured to control the multiplexer circuit in response to a column address.

In an exemplary embodiment of the present invention, if the column address is a defective column address, the redundancy control circuit controls the multiplexer circuit so that one of main data bits input to the multiplexer circuit is replaced with one of the selected redundant data bits.

In an exemplary embodiment of the present invention, if the column address is not a defective column address, the redundancy control circuit controls the multiplexer circuit so that main data bits input to the multiplexer circuit are output regardless of the selected redundant data bits.

In an exemplary embodiment of the present invention, the redundancy control circuit is operated in response to a column address and generates the first selection signals for selecting main data bits selected by the second column gate circuit, respectively and the second selection signals for selecting one of the selected redundant data bits.

In an exemplary embodiment of the present invention, the multiplexer circuit includes multiplexers corresponding to the first selection signals, respectively.

In an exemplary embodiment of the present invention, the multiplexers select one of main data bits or the selected redundancy data bits equivalent in response to the first selection signals and the second selection signals, respectively.

According to another feature of the present invention, a NAND flash memory device including a main field and a redundant field comprises: a first page buffer circuit reading main data bits form the main field during a read operation; a second page buffer circuit reading redundant data bits from the redundant field during the read operation; a column decoder circuit generating first column selection signals and second column selection signals in response to a column address; a first column gate circuit configured to simultaneously select a part of the read main data bits and a part of the read redundant data bits in response to the first column selection signals; a second column gate circuit configured to select a part of the selected main data bits in response to the second column selection signals; a multiplexer circuit receiving main data bits from the second column gate circuit, and redundant data bits from the first column gate circuit; and a redundancy control circuit configured to control the multiplexer circuit in response to the column address.

In an exemplary embodiment of the present invention, if the column address is a defective column address, the redundancy control circuit controls the multiplexer circuit so that one of the main data bits input to the multiplexer circuit is replaced by one of the selected redundant data bits.

In an exemplary embodiment of the present invention, if the column address is not a defective column address, the redundancy control circuit controls the multiplexer circuit so that all the main data bits input to the multiplexer circuit are output regardless of the selected redundant data bits.

In an exemplary embodiment of the present invention, the redundancy control circuit is operated in response to a column address and generates first selection signals for selecting respective main data bits selected by the second column gate circuit and second selection signals for selecting one of the selected redundant data bits.

In an exemplary embodiment of the present invention, the multiplexer circuit includes multiplexers corresponding to the first selection signals, respectively.

In an exemplary embodiment of the present invention, each of the multiplexers selects a corresponding main data bit or one of the selected redundant data bits in response to a corresponding first selection signal and the second selection signals.

According to another embodiment of the present invention, a reading method of a NAND flash memory device having a main field and a redundancy field comprises: simultaneously reading main data bits from the main field and redundant data bits from the redundant field during a read operation; generating first column selection signals and second column selection signals in response to a column address; simultaneously selecting a part of the read main data bits and a part of the read redundant data bits in response to the first column selection signals; selecting a part of the selected main data bits in response to the second column selection signals; and selectively outputting main data bits and redundant data bits in accordance with redundancy information.

In an exemplary embodiment of the present invention, the redundancy information is produced by the column address.

BRIEF DESCRIPTION OF THE DRAWINGS

The above and other features of the present invention will become more apparent to those of ordinary skill in the art by describing in detail preferred embodiments thereof with reference to the attached drawings in which.

DETAILED DESCRIPTION OF PREFERRED EMBODIMENTS

Figure 1:
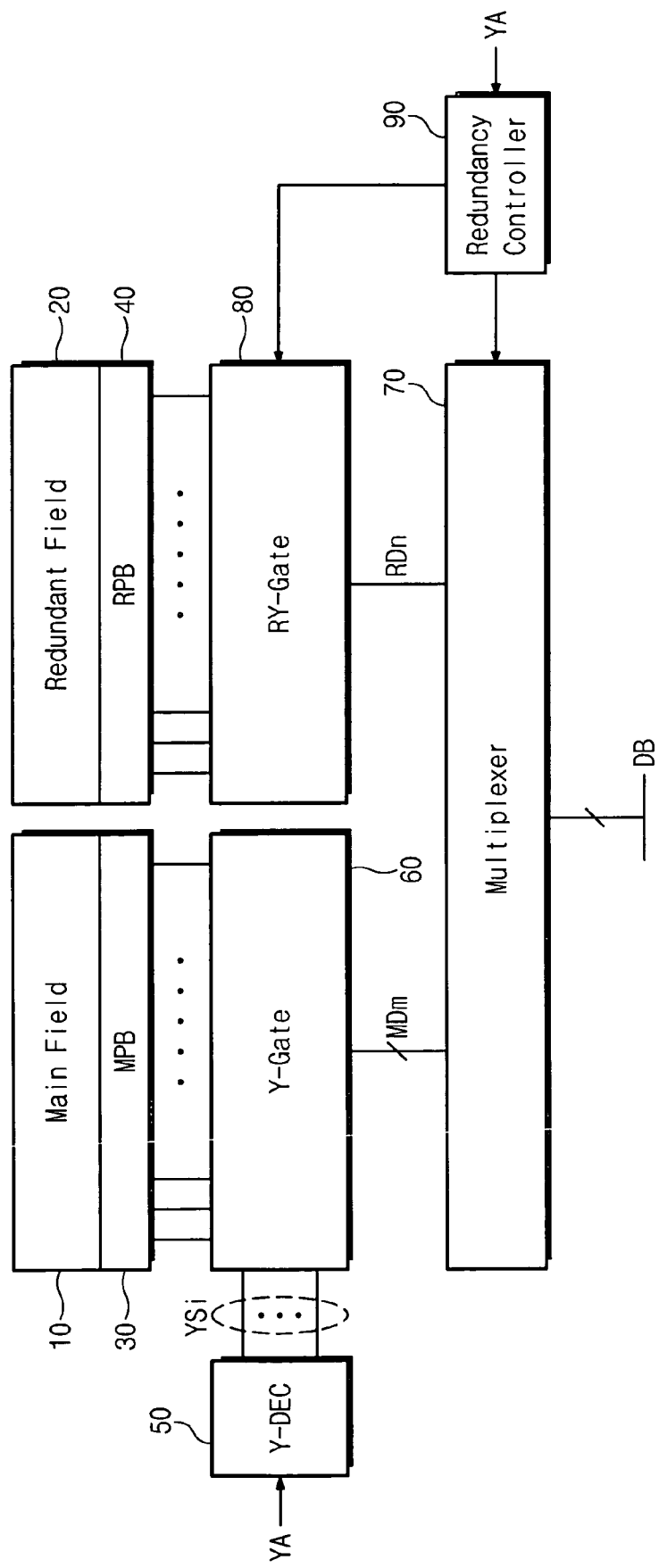
FIG. 1 is a block diagram schematically showing a conventional NAND flash memory device.
Figure 2:
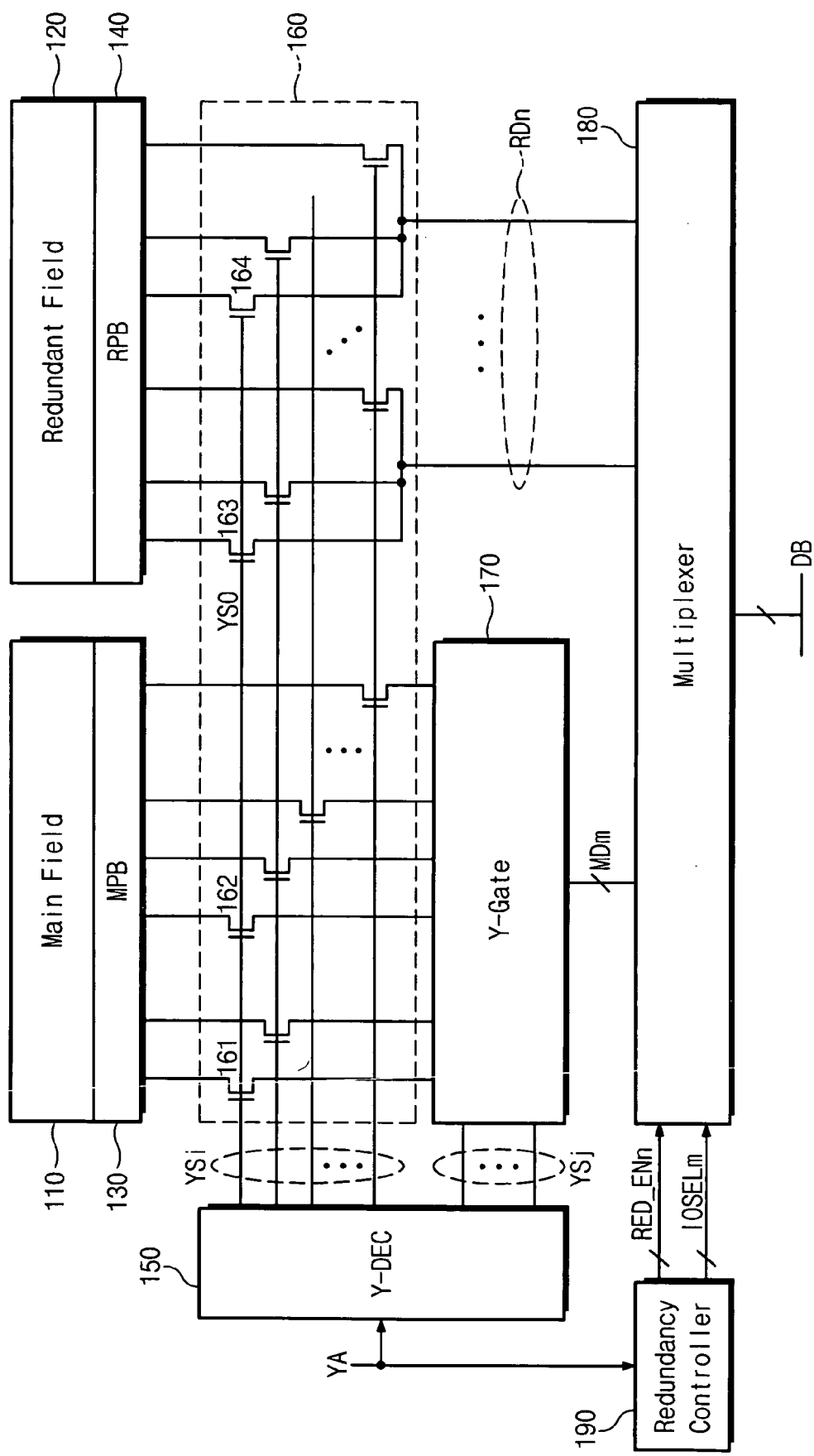
FIG. 2 is a block diagram schematically showing a NAND flash memory device in accordance with an embodiment of the present invention.

The present invention will now be described more fully hereinafter with reference to the accompanying drawings, in which preferred embodiments of the invention are shown. FIG. 2 is a block diagram schematically showing a NAND flash memory device according to the present invention.

Referring to FIG. 2, a NAND flash memory device according to the present invention includes a main field 110 and a redundant field 120. The main field 110 includes a memory cell array for storing a main data. A plurality of rows or word lines and a plurality of main columns or main bit lines are arranged in the memory cell array. As widely known, the memory cell array of the NAND flash memory device has a NAND string structure. The redundant field 120 includes a redundant memory cell array for replacing defective columns of the main field 110, and the redundant memory cell array has the same structure as the main field 110. A main page buffer circuit 130 reads data stored in the main field 110 in a page unit during a read operation. The redundant page buffer circuit 140 reads data stored in the redundant field 120 during the read operation. The main field 110 and the redundant field 120 are configured to share the same row. In other words, if a row or page is selected, the main page buffer circuit 130 and the redundant page buffer circuit 140 read data from the memory cells of the main and the redundant fields 110 and 120 which are connected to the selected row. The main page buffer circuit 130 and the redundant page buffer circuit 140 include the widely known page buffers.

Referring to FIG. 2, a NAND flash memory device according to the present invention further includes a column decoder circuit 150, a first column gate circuit 160 and a second column gate circuit 170. The column decoder circuit 150 generates column selection signals YSi and YSj in response to a column address YA, and the first column gate circuit 160 selects a part of the main columns of the main field 110 or the main page buffers and a part of the redundant columns or redundant page buffers in response to the column selection signal YSi. In other words, the first column gate circuit 160 is formed to select the main and the redundant columns (or page buffers) in response to the column selection signals YSi at the same time. This means that some redundant columns are used for replacing the specified main columns. Accordingly, if one of the column selection signals YSi is activated, transistors (e.g., 161, . . . , 162, . . . , 163, . . . , and 164, . . . ) controlled by the activated column selection signals, for example YS0 are turned on at the same time. The second column gate circuit 170 selects a part (e.g., a byte or word) of the main columns (or main page buffers) selected by the first column gate circuit 160 in response to the selection signals YSj. The main data bits MDm output from the second column gate circuit 170 and the redundant data bits RDn output from the first row gate circuit 160 are transmitted to a multiplexer circuit 180.

The NAND flash memory device according to the present invention further includes a redundancy control circuit 190 storing address information representing defective columns. The redundancy control circuit 190 generates the first selection signals I0SLTm and the second selection signals RED_ENn as redundancy information in response to the column address YA. For example, if the input column address YA is determined to be a stored defective column address, the redundancy control circuit 190 activates one of the first selection signals I0SELm and one of the second selection signals RED_ENn. The multiplexer circuit 180 is operated in response to the selection signals I0SELm and RED_ENn provided from the redundancy control circuit 190, and receives the main data bits MDm and the redundant data bits RDn.

Figure 3:
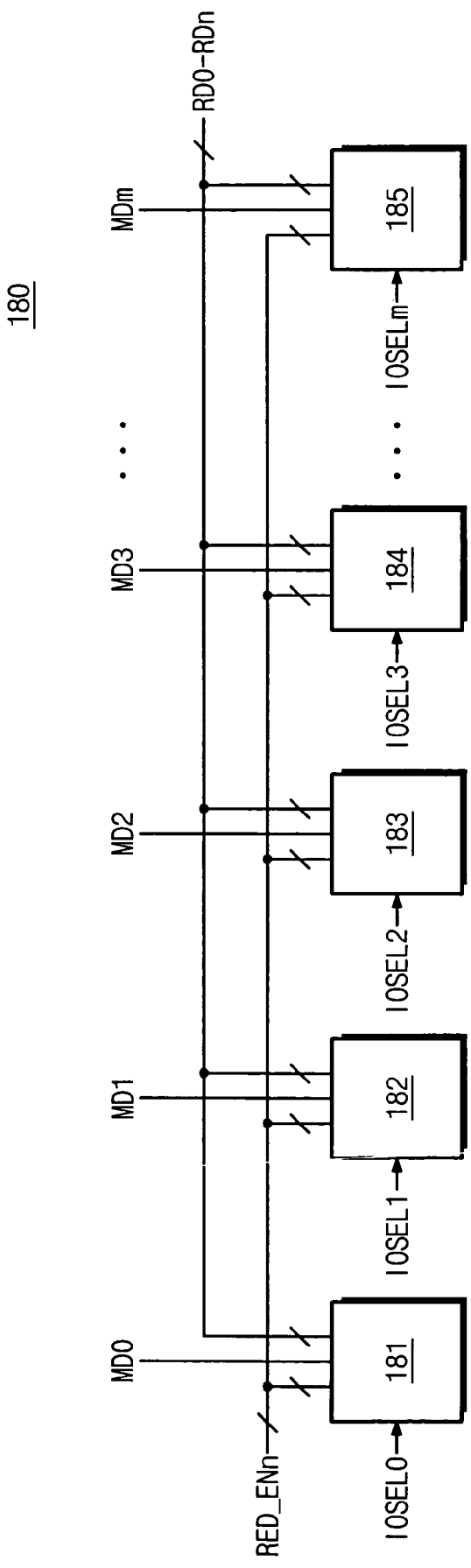
FIG. 3 is a block diagram showing a multiplexer circuit of FIG. 2.

Referring to FIG. 3 showing a multiplexer circuit 180 in accordance with an exemplary embodiment, the multiplexer circuit 180 of the present invention includes a plurality of, for example, 8 or 16 multiplexers 181–185. The number of multiplexers equals that of the main data bits which are selected by the second column gate circuit 170. The main data bits are provided to each multiplexer. The redundant data bits selected by the first column gate circuit 160 is provided to each multiplexer. In addition, the second selection signals RED_ENn are applied to each multiplexer, and the second selection signals RED_ENn are used for selecting one of the redundant data bits applied to each multiplexer. The first selection signals I0SELm are applied to corresponding multiplexers, respectively. If a current column address is not a defective column address, the first selection signals I0SELm are deactivated. This enables the multiplexers 181–185 to select the main data bits regardless of the second selection signals RED_ENn. If the current column address is a defective column address, one of the first selection signals I0SELm, for example, I0SEL0 is activated. The multiplexer 181 to which the activated selection signal I0SEL0 is applied selects one of the redundant data bits in response to the second selection signals RED_ENn instead of the main data bit MD0. The other multiplexers 182–185 select corresponding main data bits, respectively.

If a reading operation begins, a row (or a page) is selected, and the main page buffer 130 and the redundant page buffer circuit 140 read data from the memory cells of the selected row at the same time. Next, the column decoder circuit 150 activates the specific column selection signal YS0 in response to the column address YA. As the column selection signal YS0 is activated, the page buffers of the main and redundant page buffer circuits 130 and 140 are selected at the same time. In other words, as the column selection signal YS0 is activated, the transistors 161, 162, 163 and 164 of the first column gate circuit 160 are turned on at the same time. This means that the specific redundant column is dedicated to replace the specific main columns. The second column gate circuit 170 selects a part of the selected main columns (e.g., ×8, ×16, etc.) in response to the column selection signals YSj.

The redundancy control circuit 190 generates the first and the second selection signals I0SELm and RED_ENn in response to the column address YA. If the column address YA is not a defective column address, the first and the second selection signals I0SELm and RED_ENn are deactivated. This means that the main data bits are selected by the multiplexer circuit. If the column address YA is a defective column address, one of the first selection signals I0SELm, for example, I0SEL0 and one of the second selection signals I0SEL0, for example, RED_EN0 will be selected. As described above, the multiplexer 181 to which the activated selection signal I0SEL0 is applied selects one of the redundant data bits in response to the second selection signals RED_ENn instead of the main data bit MD0, and the other multiplexers 812–185 select the main data bits, respectively. In other words, one of the main data bits is replaced with the redundant data bit. The page data will be output to the outside according to the above-described method, during the read operation.

As described above, as redundant columns are selected via the first column gate circuit 160 controlled by the column decoder circuit 150, no redundancy information is used to select a redundant column. This means that the main columns and the redundant columns are selected at the same time, and the time for outputting the main data is not influenced by a selection path of the redundant data. In other words, while a column address is decoded to select main and redundant columns, redundancy information is formed by the redundancy control circuit 190. Accordingly, the time for outputting the main data via the multiplexer circuit is not limited by redundancy information. In other words, the main data can be output at a higher speed.

The configuration and operation of a circuit according to the present invention has been described, but it is apparent that the present invention can be changed and modified within the technical spirit and scope of the present invention.

While the present invention has been described in detail with reference to certain preferred embodiments, it should be apparent that modifications and adaptations to those embodiments might occur to a person skilled in the art without departing from the scope of the present invention.

What is claimed is:

1. A NAND flash memory device including a main field and a redundant field comprising:
   a first page buffer circuit reading main data bits from the main field during a read operation;
   a second page buffer circuit reading redundant data bits from the redundancy field during the read operation;
   a first column gate circuit configured to select a part of the main data bits read from the main field and at the same time a part of the redundant data bits read from the redundant field in response to first column selection signals; and
   a second column gate circuit configured to select a part of the selected main data bits in response to second column selection signals.

2. The device of claim 1, further comprising:
   a multiplexer circuit receiving the main data bits from the second column gate circuit and the redundant data bits from the first column gate circuit; and
   a redundancy control circuit configured to control the multiplexer circuit in response to a column address.

3. The device of claim 2, wherein if the column address is a defective column address, the redundancy control circuit controls the multiplexer circuit so that one of the main data bits input to the multiplexer circuit is replaced with one of the selected redundant data bits.

4. The device of claim 2, wherein if the column address is not a defective column address, the redundancy control circuit controls the multiplexer circuit so that main data bits input to the multiplexer circuit are all output regardless of the selected redundant data bits.

5. The device of claim 2, wherein the redundancy control circuit is operated in response to a column address and generates the first selection signals for selecting main data bits selected by the second column gate circuit, respectively and the second selection signals for selecting one of the selected redundant data bits.

6. The device of claim 5, wherein the multiplexer circuit includes multiplexers corresponding to the first selection signals, respectively.

7. The device of claim 6, wherein each of the multiplexers selects corresponding main data bit or one of the selected redundancy data bits in response to a corresponding first selection signal and the second selection signals.

8. A NAND flash memory device including a main field and a redundant field comprising:
    a first page buffer circuit reading main data bits form the main field during a read operation;
    a second page buffer circuit reading redundant data bits from the redundant field during the read operation;
    a column decoder circuit generating first column selection signals and second column selection signals in response to a column address;
    a first column gate circuit configured to simultaneously select a part of the main data bits read from the main field and a part of the redundant data bits read from the redundant field in response to the first column selection signals;
    a second column gate circuit configured to select a part of the selected main data bits in response to the second column selection signals;
    a multiplexer circuit receiving main data bits from the second column gate circuit, and redundant data bits from the first column gate circuit; and
    a redundancy control circuit configured to control the multiplexer circuit in response to the column address.

9. The device of claim 8, wherein if the column address is a defective column address, the redundancy control circuit controls the multiplexer circuit so that one of main data bits input to the multiplexer circuit is replaced with one of the selected redundant data bits.

10. The device of claim 9, wherein if the column address is not a defective column address, the redundancy control circuit controls the multiplexer circuit so that all main data bits input to the multiplexer circuit are output regardless of the selected redundant data bits.

11. The device of claim 9, wherein the redundancy control circuit is operated in response to a column address and generates first selection signals for selecting respective main data bits selected by the second column gate circuit and second selection signals for selecting one of the selected redundant data bits.

12. The device of claim 11, wherein the multiplexer circuit includes multiplexers corresponding to the first selection signals, respectively.

13. The device of claim 12, wherein each of the multiplexers selects a corresponding main data bit or one of the selected redundant data bits in response to a corresponding first selection signal and the second selection signals.

14. A reading method of a NAND flash memory device having a main field and a redundancy field comprising:
    simultaneously reading main data bits from the main field and redundant data bits from the redundant field during a read operation;
    generating first column selection signals and second column selection signals in response to a column address;
    simultaneously selecting a part of the main data bits read from the main field and a part of the redundant data bits read from the redundant field in response to the first column selection signals;
    selecting a part of the selected main data bits in response to the second column selection signals; and
    selectively outputting main data bits and redundant data bits in accordance with redundancy information.

15. The method of claim 14, wherein the redundancy information is produced by the column address.

* * * * *